United States Patent [19]
Ochi

[11] Patent Number: 5,596,466
[45] Date of Patent: Jan. 21, 1997

[54] INTELLIGENT, ISOLATED HALF-BRIDGE POWER MODULE

[75] Inventor: Sam. S. Ochi, Cupertino, Calif.

[73] Assignee: IXYS Corporation, Santa Clara, Calif.

[21] Appl. No.: 372,525

[22] Filed: Jan. 13, 1995

[51] Int. Cl.$^6$ .................................................. H02H 5/04
[52] U.S. Cl. .......................... 361/18; 361/93; 361/103; 361/115
[58] Field of Search ............................. 361/93, 103, 115

[56] References Cited

U.S. PATENT DOCUMENTS

| | | | |
|---|---|---|---|
| 4,903,106 | 2/1990 | Fukunaga | 357/43 |
| 4,965,710 | 10/1990 | Pelly et al. | 363/56 |

OTHER PUBLICATIONS

Yamazaki, T., et al., "The IGBT with Monolithic Overvoltage Protection Circuit," *Proceedings of the 5th International Symposium on Power Semiconductor Devices and ICs* (1993), pp. 41–45.

Primary Examiner—Jeffrey A. Gaffin
Assistant Examiner—Stephen W. Jackson
Attorney, Agent, or Firm—Townsend and Townsend and Crew LLP; Joseph M. Villeneuve

[57] ABSTRACT

A power module having at least one power transistor. Each power transistor is coupled to and protected by an overvoltage clamp and desaturation detection circuit. An output current measurement system is coupled to the power module output. A junction temperature sensor is coupled to each power transistor. An isolation transformer is associated with each power transistor, the primary windings of which are connected to an isolated driver communications interface which converts logic signals to primary winding drive signals. An isolated gate driver is coupled to the secondary winding of each isolation transformer and the gate terminal of each power transistor.

17 Claims, 5 Drawing Sheets

5,596,466

INTELLIGENT, ISOLATED HALF-BRIDGE POWER MODULE

BACKGROUND OF THE INVENTION

The present invention relates to a power module with built-in overvoltage, overcurrent, and thermal protection.

In multi-kilowatt and megawatt inverter applications, output short circuits, power mesh over-voltages, and excessive operating temperatures can cause damage to systems incorporating power devices, the damage often being disproportionate to the cost of the power devices themselves. In addition to desaturation and overcurrent conditions, there are three distinct and well known causes of IGBT failure. The first is failure due to avalanche breakdown, the second is failure due to thermal or power cycling, and third is failure due to overtemperature stress.

Insulated gate bipolar transistor (IGBT) devices available today are extremely rugged. As long as the peak junction temperatures are closely controlled, such devices can withstand tremendous currents and peak power dissipations. For example, a size 7 (7.32 mm by 8.84 mm) device was repetitively tested to conduct up to 200 amps at 600 volts for 10 μs. The average junction temperature was maintained at 90° Centigrade and the test was repeated over 10,000,000 cycles (10 μs pulse at 20 Hz for 6 days) without measurable changes in device characteristics. However, the same device was only able to sustain five cycles of 10 μs avalanche breakdown current at 80 amps prior to destruction. This was because much of the 80 amps went through a very small portion of the die. In other words, where the short circuit test allowed the whole die to conduct the full 200 amps, the avalanche breakdown current was concentrated around a small fraction of the die, melting the aluminum and silicon beneath it. Prior solutions to the problem of avalanche breakdown protection have employed external circuitry, such as snubber circuits, to prevent collector or drain terminals from exceeding the power supply voltage and precipitating avalanche breakdown. Unfortunately, the desirability of snubber circuits is greatly reduced by the fact that they tend to be bulky and expensive.

In the past, failures due to temperature and power cycling have been dealt with by applying a statistically determined limit for thermal cycling prior to replacement of power devices. Unfortunately, such a limit is arbitrary and falls to account for individual device variation and actual operating conditions.

The thermal resistance from the power device junction to its case, $R_{THJC}$, is a measure of die attach integrity. If any of the interfaces between the wafer and its outer case become damaged, start to crack, or delaminate, the thermal resistance increases. An increase in $R_{THJC}$ is an early indication that one or more of the device interfaces (e.g., the solder to copper interface) has fatigued. Previous systems have measured this parameter by allowing the power device under test to dissipate a fixed amount of power, and then measuring the difference between surface junction temperature of the device and the package temperature of the device at the point at which it is attached to the heat sink. The power dissipated is then divided by the temperature difference to obtain $R_{THJC}$ in W/° C. To obtain reliable and repeatable measurements of $R_{THJC}$, placement of the temperature probes must be done with great care, and sufficient time must pass between measurements to allow the device to reach thermal equilibrium.

The collector to emitter saturation voltage, $V_{CE(SAT)}$, of an IGBT measured at its rated current at 90° C. ($I_{C90}$) is a measure of the basic current carrying capacity of a power device. If $V_{CE(SAT)}$ starts to increase, this is an indication that there is potential device damage or wire bond failure, which, although allowing the device to operate, significantly degrades performance. During power and thermal cycling, wire bonds are stretched and compressed during the expansion and contraction of the device making them brittle and increasing their electrical resistance. In addition, the power device itself may crack or fracture due to this expansion and contraction, also resulting in an increase in the measured $V_{CE(SAT)}$. Previous systems have measured this parameter by turning on the power device, supplying a known amount of current to pass through the device, and measuring the resultant $V_{CE(SAT)}$ across the collector (drain) and emitter (source) of the device.

Overtemperature failure may be anticipated through the monitoring of power device junction temperatures. The only way in which previous systems have systematically dealt with overtemperature failure is periodic replacement of power devices during normally scheduled preventative maintenance. The timing of replacement is determined statistically by using extrapolated semiconductor reliability data and calculating expected device lifetimes. Depending upon the application, a particular power device is typically replaced at some time between 10% and 50% of the calculated lifetime for the device. After further data is gathered regarding device replacement in a particular application, an even more aggressive replacement schedule might be implemented.

Thus, there is a need for a power device which provides solutions to all of the above-described problems.

SUMMARY OF THE INVENTION

The present invention provides a power module which addresses each of the above-described failure modes. The module protects its power transistors from overcurrent, overvoltage, overtemperature, and short circuit conditions. The module further provides digital fault status as well as analog outputs which allow the user to monitor trends in various module parameters. The module also provides high voltage isolation for both power and signal communications to prevent power module failures from propagating throughout the system employing the power module.

More specifically, a power module according to the invention includes at least one power transistor, with each power transistor coupled to and protected by an overvoltage clamp and desaturation detection circuit. An output current measurement system is coupled to the power module output. A junction temperature sensor is coupled to each power transistor. An isolation transformer is associated with each power transistor, the primary windings of which are connected to an isolated driver communications interface which converts logic signals to primary winding drive signals. An isolated gate driver is coupled to the secondary winding of each isolation transformer and the gate terminal of each power transistor.

In one embodiment, the power module has two power transistors forming a half-bridge inverter. In a more specific embodiment, the power transistors forming the half-bridge inverter are insulated gate bipolar power transistors.

Another embodiment includes a power source isolation transformer with at least one secondary winding. An isolated power source is coupled to the primary winding of the isolation transformer, and a plurality of voltage regulators are coupled to the secondary windings of the isolation transformer for supplying power to the isolated gate drivers.

In one embodiment, each of the overvoltage clamp and desaturation detection circuits includes an avalanche diode. The avalanche diode associated with a particular overvoltage clamp and desaturation circuit is fabricated on a single semiconductor substrate with the power transistor to which the particular overvoltage clamp and desaturation circuit is coupled.

A further understanding of the nature and advantages of the present invention may be realized by reference to the remaining portions of the specification and the drawings.

DESCRIPTION OF THE SPECIFIC EMBODIMENTS

As mentioned above, there are various external solutions for the described power device failure modes. However, a power module designed according to the present invention directly addresses each failure mode, providing superior solutions.

Figure 1:
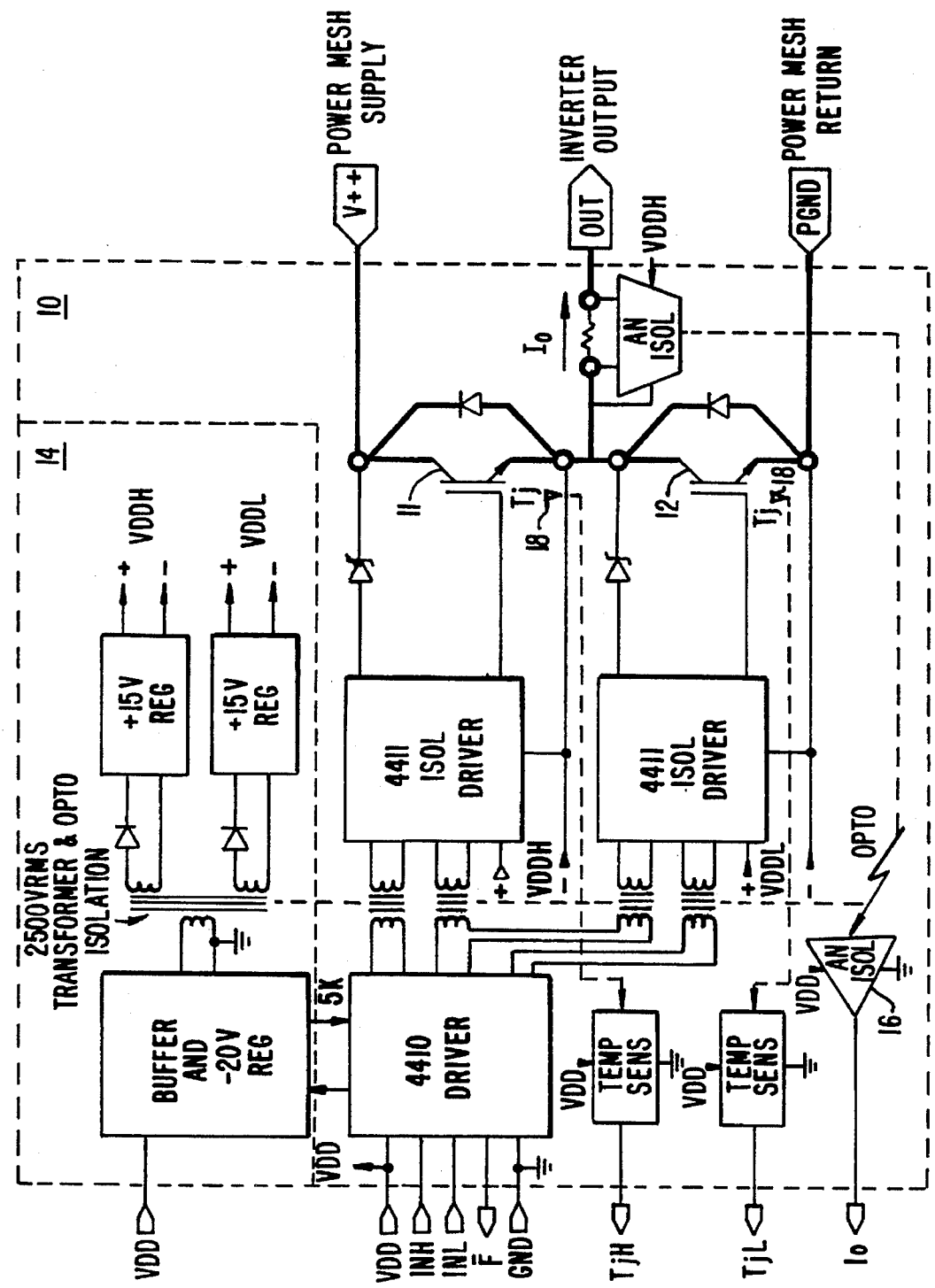
FIG. 1 is a simplified block diagram of one embodiment of the present invention.

FIG. 1 is a simplified block diagram of one embodiment of the present invention. The power module 10 shown is designed to directly interface to a pulse width modulator (PWM) controller by means of input terminals INH and INL, the high and low side inputs respectively. Power module 10 includes a pair of 200 Amp Size 9 (15.6 mm by 13 mm) IGBT devices 11 and 12 in a totem-pole or half-bridge inverter configuration coupled between a high power mesh supply terminal V++ and a power mesh return terminal PGND. IGBT 11 is the high side output device which conducts the positive-going portion of the output waveform, and IGBT 12 is the low side output device which conducts the negative-going portion of the output waveform. Power is provided to module 10 by means of power supply terminal VDD which is referenced to ground terminal GND. Power module 10 provides 2500 VAC of isolation between system and power output bus grounds. The system ground referenced isolated driver control integrated circuit 4410 provides two-way communications between the two isolated gate driver integrated circuits 4411. An internal DC to multiple output isolated DC converter 14 powers the isolated drivers and one side of the analog isolation amplifier. An isolation amplifier 16 monitoring a voltage drop across a current sense resistor converts the inverter output current, $I_o$, to a ground referenced analog output voltage with a scaling of 10 mV/amp, the voltage appearing on output terminal Io. Temperature sensor devices 18 are physically mounted on top of each IGBT device 12 to provide continuous temperature data with a scaling of 10 mV/° C. The high and low side junction temperature signals ($T_{jH}$ and $T_{jL}$) appear on output terminals TjH and TjL respectively. A fault signal indicating a number of possible failure modes appears on output terminal $\overline{F}$.

Figure 2:
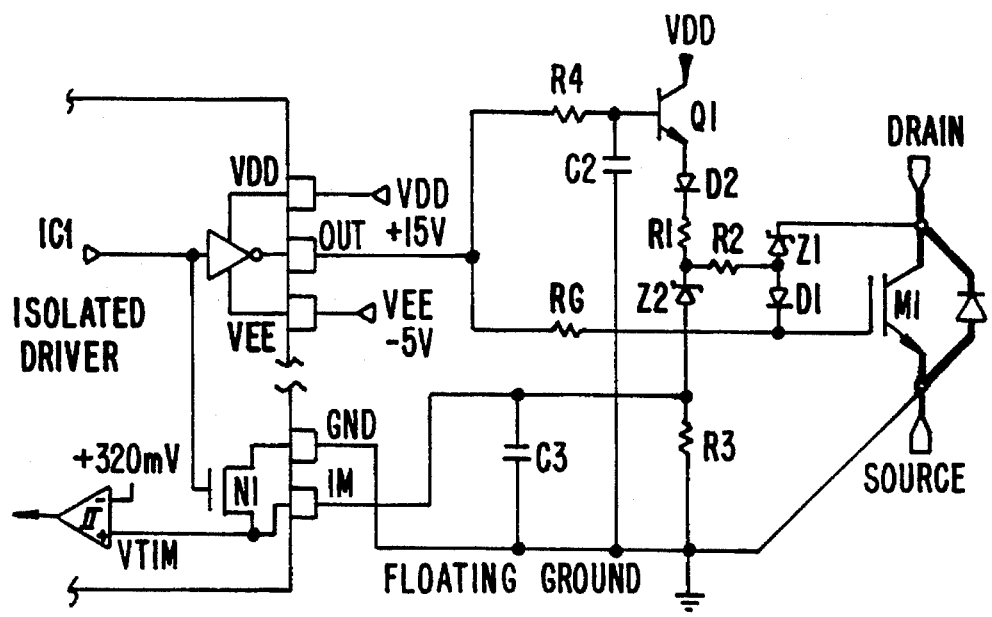
FIG. 2 is a schematic diagram of a combination overvoltage clamp and desaturation detection circuit used in one embodiment of the present invention.

FIG. 2 is a schematic diagram of a combination overvoltage clamp and desaturation detection circuit used in one embodiment of the present invention to protect each of the high and low side power devices. The power module has a built-in overvoltage clamp so that the full short circuit current up to 600 Amps may be let through without destruction. This feature alone can either reduce the complexity of snubbers or totally eliminate them. When the output power device M1 is off, the OUT terminal of integrated circuit IC1 keeps transistor M1 off by applying a negative bias (with respect to its source potential), $V_{EE}$, to the gate of transistor M1 through resistor $R_G$, the series gate resistor. IC1 also drives the base of transistor Q1 to $V_{EE}$ through resistor R4 so that its base-emitter junction is reverse biased and off. Diode D2 prevents the base-emitter junction of transistor Q1 from zenering during this period. FET N1 which is internal to IC1, shorts resistor R3 and capacitor C3 to ground. The clamp avalanche diode Z1 has a reverse breakdown voltage of $0.9*V_B$, where $V_B$ is the avalanche breakdown voltage rating of transistor M1. In the event of an overvoltage at the drain of M1, as soon as the drain potential reaches $0.9*V_B$, Z1 breaks down and starts conducting. The current through Z1 charges the input capacitance of transistor M1, thereby driving up the gate to source voltage of M1 ($V_{GSM1}$). As the drain to source voltage of M1 ($V_{DSM1}$) continues to climb, $V_{GSM1}$ begins rising at the same rate. Soon $V_{GSM1}$ is sufficiently high to overcome the input threshold and the gate starts to conduct current. The current flow through M1 creates a voltage drop across the load (not shown) which tends to reduce the rate of increase of $V_{DSM1}$. As $V_{DSM1}$ continues to climb, $V_{GSM1}$ also continues to become more positive. As long as $V_{DSM1}$ does not exceed $V_B$, M1 can conduct a full short circuit current of at least 5 times its rated current at 90° C., and greater if $V_{GSM1}$ becomes greater than 15 volts during this period. In effect, $V_{DSM1}$ will clamp to a voltage which is equal to the sum of the reverse breakdown voltage of diode Z1 plus the forward drop of diode D1 plus $V_{GSM1}$.

The desaturation detection circuit is enabled only after M1 has been sufficiently turned on. As M1 approaches saturation, the OUT terminal of IC1 drives the base of Q1 to $V_{DD}$ through resistor R4. The value of capacitor C2 is chosen to delay the enabling of the desaturation detection circuitry for approximately 10 μs, or until M1 has gotten sufficiently close to saturation. Under normal saturation conditions, the drain terminal of M1 is at approximately 2 volts. This causes Z1 to be forward biased, pulling the voltage at the cathode of zener diode Z2 down, thereby preventing Z2 from conducting current in the reverse direction. If the drain terminal of M1 does not drop below a certain value within 10 μs of turn-on, or M1 comes out of saturation during normal operation, the voltage at the cathode of Z2, a 7.5 volt zener, will ramp up, eventually reverse biasing Z1 and shutting it off. When Z2 reaches its zener voltage, it will break down and begin conducting in the reverse direction. The resulting voltage levels in the circuit can be determined from the voltage at the emitter of Q1, namely 14.3 volts. By subtracting 7.5 volts (the reverse breakdown voltage of Z2) and 0.7 volts (the forward voltage drop of D2) from 14.3 volts, it can be determined that a total of 6.1 volts will be shared across resistors R1 and R3. If resistor R1 is 6.2 kΩ and resistor R3 is 1 kΩ, R3 will have 0.83 volts developed across it, thus exceeding the 320 mV reference level and tripping comparator 20. Therefore, the actual desaturation sense trip point at the drain of transistor M1 is set by the reverse breakdown voltage of Z2 (7.5 volts), plus the threshold voltage of comparator 20 (0.32 volts), less the forward voltage drop of diode Z1 (about 0.8 volts), yielding a value of approximately 7 volts. Thus, any drain voltage greater than 7 volts will trip the desaturation detection circuit.

Resistor R2 limits any damaging currents from flowing into the desaturation detection circuit whenever diode Z1 breaks down during V++ bus or output load transients. The primary purpose of capacitor C3 is to provide noise faltering for the IM input of IC1. When a desaturation condition occurs, capacitor C3 along with the parallel combination of resistors R1 and R3 determine both the response time of the desaturation detection circuit to a desaturation event, and the time it takes to reset the desaturation detection circuit once M1 returns to normal operation. Where capacitor C3 is 1000 pF, resistor R3 is 1 kΩ, and resistor R1 is 6.2 kΩ, the reset delay (i.e., the time required to discharge capacitor C3 from 830 mV to 320 mV) turns out to be slightly less than 1 μs. The circuit's response time to a desaturation event (i.e., the time required to charge capacitor C3 from 0 to 320 mV) is slightly less. The turn-on delay of approximately 10 μs determined by the combination of resistor R4 and capacitor C2 only affects the desaturation delay during initial turn-on.

In one embodiment of the present invention, the avalanche diode, Z1, of a particular overvoltage clamp and desaturation circuit may be fabricated on a single semiconductor substrate with the power transistor, M1, to which the particular overvoltage clamp and desaturation circuit is coupled.

Figure 3:
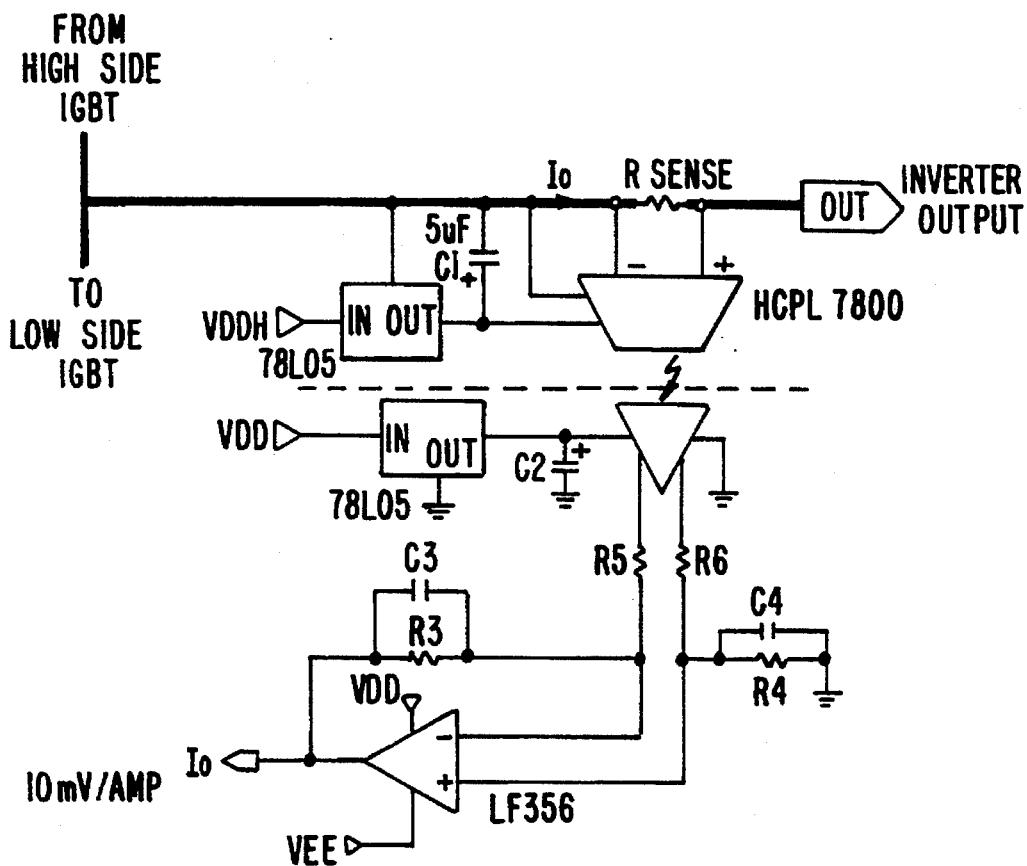
FIG. 3 is a schematic diagram of an output current sensor circuit used in one embodiment of the present invention.

FIG. 3 is a schematic diagram of an output current sensor circuit used in one embodiment of the present invention. An HCPL7800 isolation amplifier monitors the voltage drop across resistor $R_{SENSE}$=0.001 Ohm resistor. The ground referenced portion of the isolation amplifier is fed differentially into an LF356 operational amplifier set for a gain of 1.25. The HPCL7800 is pre-adjusted for a gain of 8 so that an overall gain of 10 is achieved to obtain the desired 10 mV/Amp.

Figure 4:
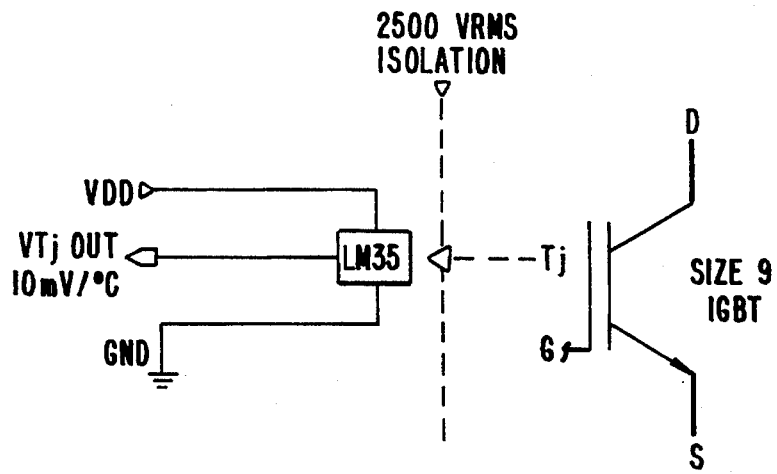
FIG. 4 is a schematic diagram of an IGBT junction temperature measurement circuit used in one embodiment of the present invention.

FIG. 4 is a schematic diagram of an IGBT junction temperature measurement circuit used in one embodiment of the present invention. An LM35 centigrade temperature sensor is placed on top of each Size 9 IGBT. Care is taken in the placement and positioning to minimize common mode noise problems especially for the high side output device, and at the same time provide good thermal contact. The output voltage scaling is 10 mV/° C.

By monitoring three continuous analog output parameters ($I_o$, $T_m$, and $T_{jL}$) with the circuits of FIG. 3 and 4, as well as the heat sink temperature ($T_A$) and computing the effective $V_{CE(SAT)}$ and $R_{THJC}$ of the two output IGBT devices, the user of the power module can predict and thus prevent field failures due to temperature and power cycles. Comparing the computed results with the initial factory supplied data to determine if the variations are within allowable limits will provide a definitive snapshot of the health of the power module. This is far superior to employing an arbitrary, although statistically determined, limit for thermal cycling prior to replacement.

As discussed above, the collector to emitter saturation voltage, $V_{CE(SAT)}$, of an IGBT measured at $I_{C90}$ is a measure of the basic current carrying capacity of the device. If $V_{CE(SAT)}$ starts to increase, this is an indication that there is potential latent device damage or wire bond failure. Continuous monitoring of this parameter provides an early warning for such failure modes.

Likewise, overtemperature failure prevention is addressed by keeping track of the junction temperatures of the power devices, $T_{jH}$ and $T_{jL}$, over time and verifying that they are under the maximum allowable temperatures. Trend data analysis techniques can then be used to decide on corrective and preventive actions.

The power module also provides a digital status signal output in addition to the three continuous analog voltage outputs described above. Specifically designed for intelligently controlling and protecting devices switching high power levels, the power module provides the necessary feedback signals to prevent, avoid, and even predict damaging system behavior. The module provides fast shutdown protection for detected inverter output desaturation or overcurrent conditions, and incorporates an ultra-fast active device overvoltage clamp circuit to prevent module damage from uncontrolled avalanche breakdowns.

Figure 5:
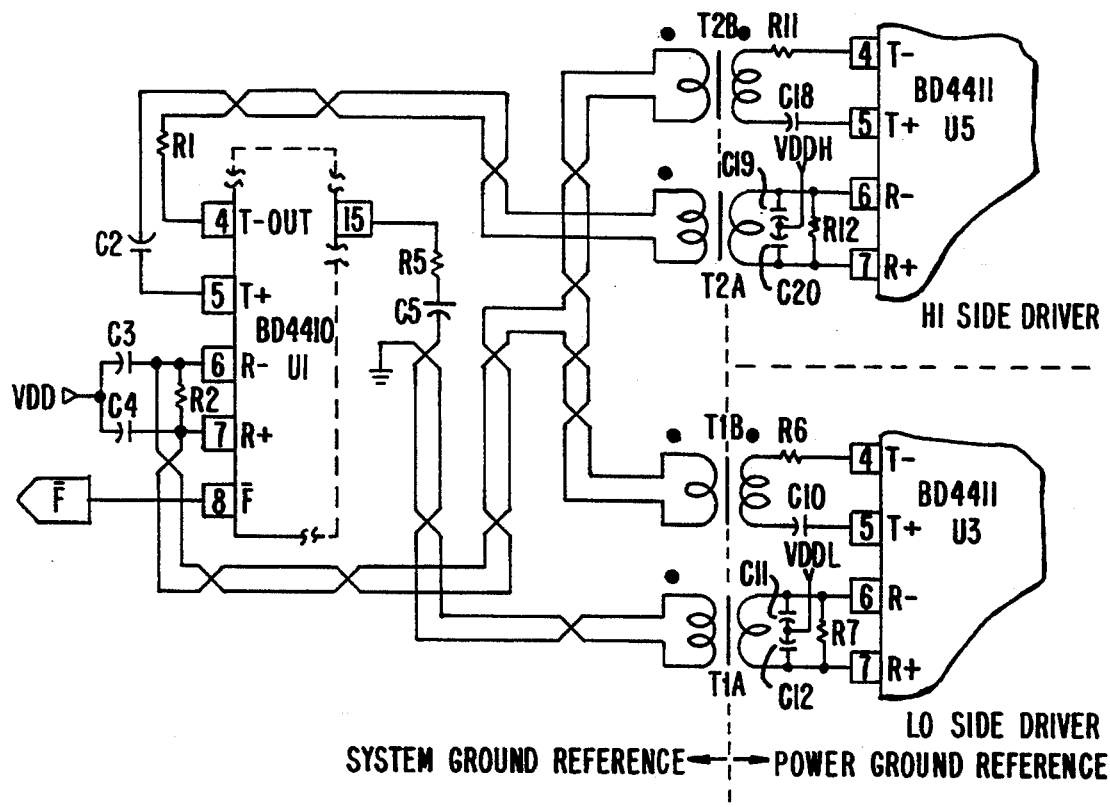
FIG. 5 is a schematic diagram illustrating isolation circuitry between the driver communications interface and the gate drivers of one embodiment of the present invention.

FIG. 5 is a schematic diagram illustrating isolation circuitry between the driver communications interface and the gate drivers of one embodiment of the present invention. In the figure, system ground based U1 (a BD4410 device) communicates with U3 and U5 (two BD4411 devices) through two high speed dual pulse transformers T1 and T2, each capable of 2500 VAC of isolation. U1 transmitter outputs, T+ and T−, drive primary T2A, and the OUT output drives primary T1A. Resistors R1 and R5 act as the current limiting resistors. Capacitors C2 and C5 are the DC blocking capacitors for the primaries of T1A and T2A, the corresponding secondaries of which are applied to the receiver inputs of U3 and U5. C3 and C4 serve as noise bypass capacitors for the receiver inputs of U1, and R2 as a noise damping component to reduce ambient magnetically and capacitively coupled noise pickup. The signal lines coupled to both the transmitter outputs and the receiver inputs are tightly twisted to reduce noise transmission and pickup.

The U3 receiver inputs are connected to the T1A secondary and receive the isolated low side gate driver control signal transmitted by the OUT terminal of U1. The U5 receiver inputs are connected to the T2A secondary and receive the isolated high side gate driver output control signals transmitted by T+ and T− of U1. The U1 receiver inputs are series connected to the secondaries of T1B and T2B, and receive any isolated low or high side fault signal transmitted by either U3 or U5. A fault signal, if present, will be latched by U1 and displayed as a low going $\overline{F}$ output. The two-way communications between U1 on one hand, and U3 and U5 on the other, are accomplished despite the fact that the interface tends to experience extremely high ambient dV/dt and dI/dt noise.

Figure 6:
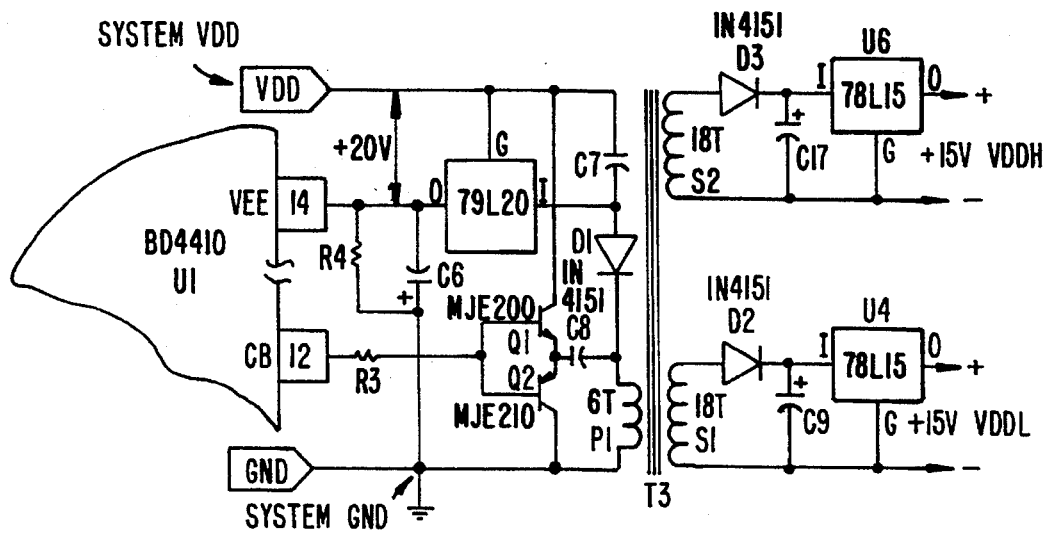
FIG. 6 is a schematic diagram illustrating an isolated power source used in one embodiment of the present invention.

FIG. 6 is a schematic diagram illustrating an isolated power source used in one embodiment of the present invention. In the figure, the U1 charge pump oscillator output, CB (pin 12), buffered through Q1 and Q2, and free-running at approximately 600 KHz, provides full time power to the isolated low side and high side drivers through T3. T3 is a transformer with a primary P1 and two isolated secondaries S1 and S2. (T3 employs 6 turns of #30 wire for the primary and 18 turns of #30 wire for the two secondaries, all segments being wound on Ferroxcube #204T250-3C85 or its equivalent). Through R3, the CB output drives the bases of two discrete bipolar transistors, Q1 (MJE200 (NPN)) and Q2 (MJE210 (PNP)), which are connected in a complementary emitter follower configuration with both the emitters and bases common, and their respective collectors connected between the VDD=15 V supply and ground. Resistor R3 reduces the transistor in-rush currents during start-up, and the common emitter output drives the primary winding of T3 through a DC blocking capacitor C8. The ground referenced bipolar square wave signal available on the primary of T3 is rectified by diode D1 and applied to the input of U2 (79L20), a three pin 20 V negative regulator IC. The input (I) of U2 is coupled to the anode of D1, the output (O) to the VEE pin of U1, and the ground (G) is returned to VDD. With Vdd=15 V, U2 regulates the VEE pin of U2 to −5 V. U2 effectively replaces the internal 20 V regulator built into U1 so that its internal fault detection circuitry is not defeated. The secondary outputs of T3 are rectified and regulated to produce the +15 V supplies needed to provide power to the high and low side gate drivers.

Figure 7:
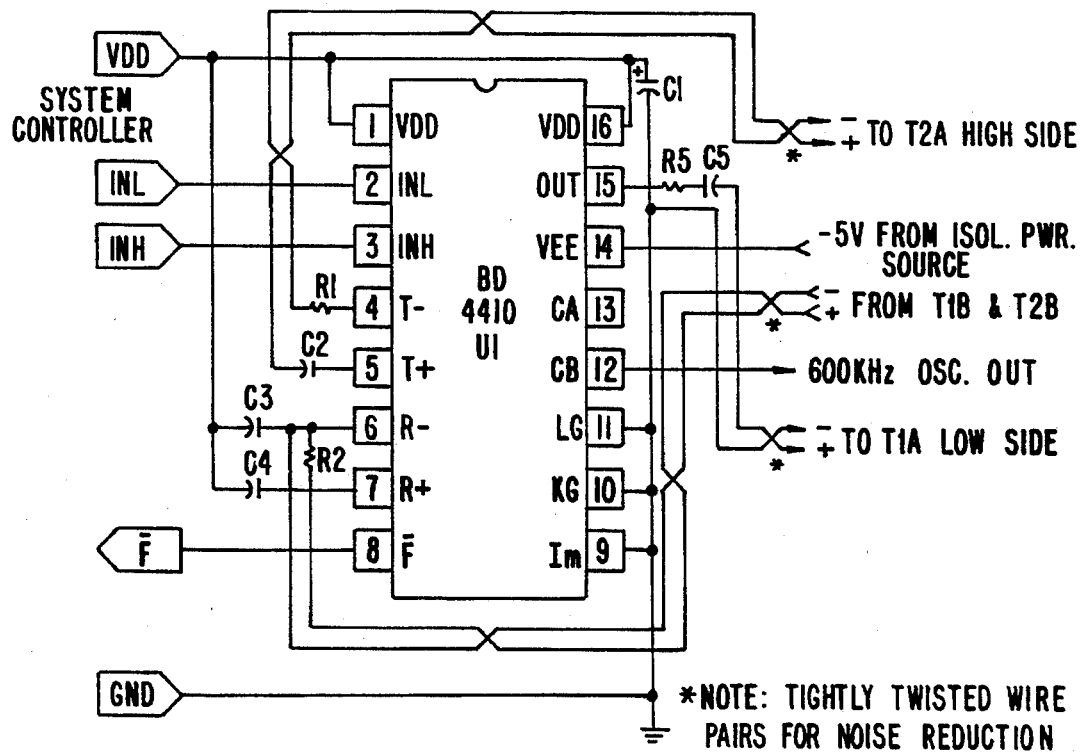
FIG. 7 is a schematic diagram of an isolated driver communications interface used in one embodiment of the present invention.

FIG. 7 is a schematic diagram of an isolated driver communications interface used in one embodiment of the present invention. This circuit takes the low side (INL) and the high side (INH) CMOS level logic from the System Controller and drives the communications pulse transformers T2A and T1A as shown and described with reference to FIG. 5. The series connected fault transmission signals from T1B and T2B are applied to the receiver inputs of U1 where they are processed and presented as a low going $\overline{F}$ output back to the PWM controller (not shown).

The U1 diagnostic fault output, $\overline{F}$, is a logical OR of both the high side and the low side faults, and is the digital status signal referred to earlier. The $\overline{F}$ output is an open drain output with the low going $\overline{F}$ output indicating a fault condition of either the isolated high side or low side device. FIG. 5 shows the U1 to U3/U5 communications interface using signal pulse transformers. During normal operation of U3 or U5 as an isolated gate driver, the $\overline{F}$ output from U1 will go low whenever the following conditions are detected:

a) an undervoltage condition, $V_{DD}$=10.5 V±1.5 V, or an overvoltage condition, $V_{DD}$=17.5 V±1.5 V, of either the low side $V_{DD}$ or the high side $V_{DD}$;

b) a condition where the $V_{EE}$ generator output of U1, U3, or U5 is less negative than −3.9 V+0.9 V; or c) the detection of an overcurrent or desaturation condition by having the Im input of either driver go above its $Vt_{Im}$=320 mV threshold. When $\overline{F}$ goes low due to a detected high side or low side fault, the driver output which was "on" (OUT=$V_{DD}$) prior to the fault will go "off" by dropping to the $V_{EE}$ potential within 200 ns.

Figure 8:
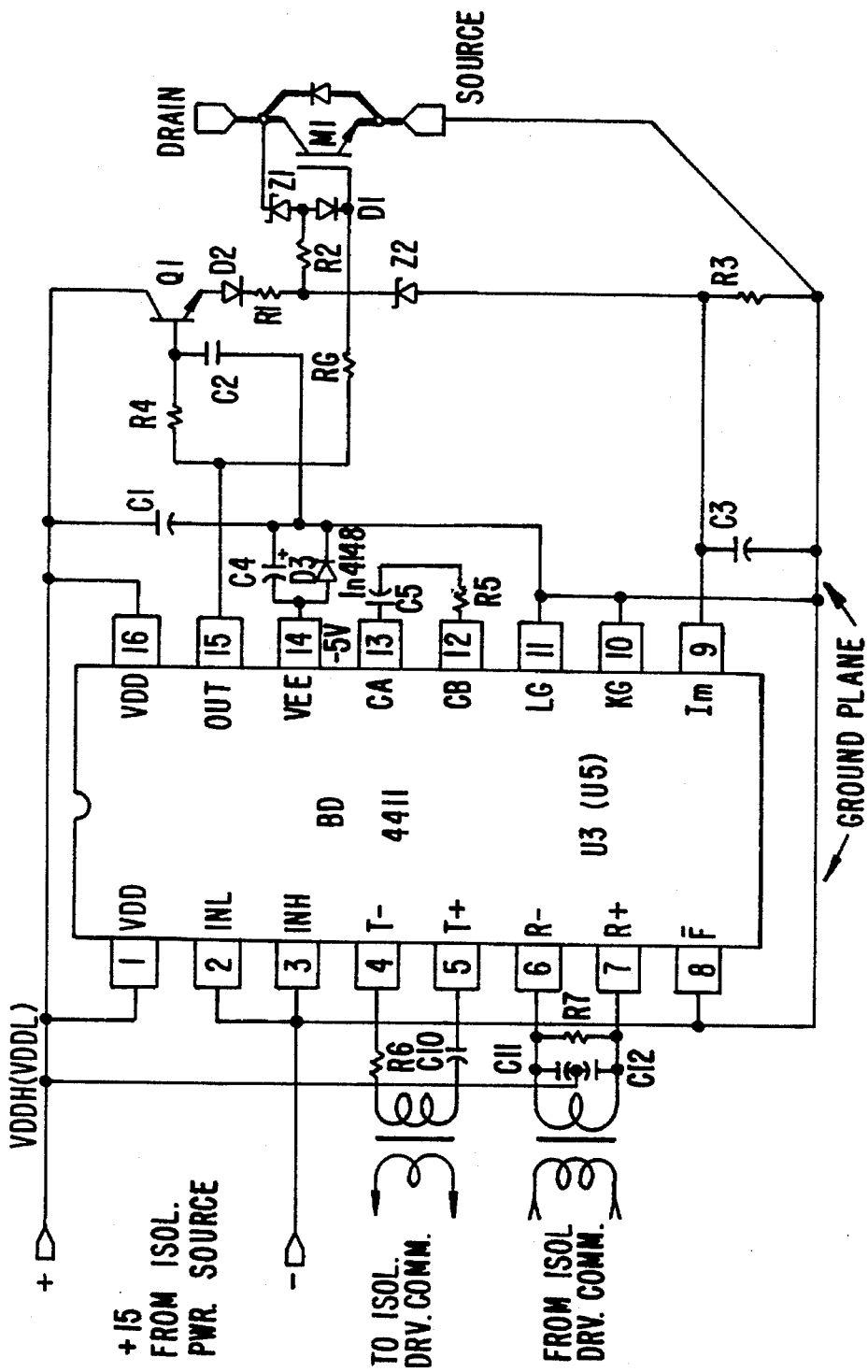
FIG. 8 is a schematic diagram of an isolated gate driver used in one embodiment of the present invention.

FIG. 8 is a schematic diagram of an isolated gate driver used in one embodiment of the present invention. This circuit is identical for both the high side gate driver as well as the low side gate driver. For coupled magnetic and capacitive noise immunity and rejection, it is essential that a full ground plane be referred with a minimum of inductance to the drive IGBT source. This literally electrically floats the isolated gate driver with respect to the power device source, thereby effectively cancelling stray source inductance.

While the invention has been particularly shown and described with reference to specific embodiments thereof, it will be understood by those skilled in the art that the foregoing and other changes in the form and details may be made therein without departing from the spirit or scope of the invention.

What is claimed is:

1. A power module, comprising:
at least one power transistor coupled to a power module output, each power transistor having a gate drive terminal;
at least one overvoltage clamp and desaturation detection circuit, one overvoltage clamp and desaturation detection circuit being coupled to each power transistor;
an output current measurement system coupled to the power module output;
at least one junction temperature sensor, one junction temperature sensor being coupled to each power transistor;
at least one isolation transformer having a primary winding and at least one secondary winding;
an isolated driver communications interface coupled to the primary winding of each isolation transformer, the isolated driver communications interface being for converting logic signals to primary winding drive signals; and
at least one isolated gate driver, one isolated gate driver being coupled to the at least one secondary winding of each isolation transformer and the gate terminal of each power transistor.

2. The power module as recited in claim 1, further comprising:
a power source isolation transformer having a primary winding and at least one secondary winding;
an isolated power source coupled to the primary winding of the power source isolation transformer; and
a plurality of voltage regulators coupled to the secondary windings of the power source isolation transformer for supplying power to the isolated gate drivers.

3. The power module as recited in claim 1 wherein each of the overvoltage clamp and desaturation detection circuits comprises an avalanche diode, the avalanche diode of a particular overvoltage clamp and desaturation circuit being fabricated on a single semiconductor substrate with the power transistor to which the particular overvoltage clamp and desaturation circuit is coupled.

4. The power module as recited in claim 1, further comprising at least one digital fault status output terminal coupled to the isolated driver communications interface for indicating the presence of a failure mode.

5. The power module as recited in claim 1, further comprising at least one analog parameter output terminal coupled for monitoring an analog parameter of the module.

6. The power module as recited in claim 1 wherein the number of power transistors is two, the two power transistors forming a half-bridge inverter.

7. The power module as recited in claim 6 wherein the power transistors comprise insulated gate bipolar power transistors.

8. A half-bridge power module, comprising:
a first power transistor having a gate drive terminal;
a second power transistor having a gate drive terminal and forming a half-bridge inverter configuration with the first power transistor, the half-bridge inverter configuration having an output;
a first overvoltage clamp and desaturation detection circuit, the first overvoltage clamp and desaturation detection circuit being coupled to the first power transistor;
a second overvoltage clamp and desaturation detection circuits, the second overvoltage clamp and desaturation detection circuit being coupled to the second power transistor;

an output current measurement system coupled to the output of the half-bridge inverter configuration;

a first junction temperature sensor coupled to the first power transistor;

a second junction temperature sensor coupled to the second power transistor;

a first isolation transformer having a primary winding and at least one secondary winding;

a second isolation transformer having a primary winding and at least one secondary winding;

an isolated driver communications interface coupled to the primary windings of the first and second isolation transformers, the isolated driver communications interface being for converting logic signals to primary winding drive signals;

a first isolated gate driver coupled to the at least one secondary winding of the first isolation transformer and the gate terminal of the first power transistor; and a second isolated gate driver coupled to the at least one secondary winding of the second isolation transformer and the gate terminal of the second power transistor.

9. The half-bridge power module as recited in claim 8 wherein the first and second power transistors comprise insulated gate bipolar power transistors.

10. The half-bridge power module as recited in claim 8, further comprising:

a third isolation transformer having a primary winding, a first secondary winding and a second secondary winding;

an isolated power source coupled to the primary winding of the third isolation transformer; and a plurality of voltage regulators coupled to the first and second secondary windings of the third isolation transformer for supplying power to the first and second isolated gate drivers.

11. The half-bridge power module as recited in claim 8 wherein each of the first and second overvoltage clamp and desaturation detection circuits comprises an avalanche diode, the avalanche diode of the first overvoltage clamp and desaturation circuit being fabricated on a single semiconductor substrate with the first power transistor, and the avalanche diode of the second overvoltage clamp and desaturation circuit being fabricated on a single semiconductor substrate with the second power transistor.

12. The half-bridge power module as recited in claim 8, further comprising at least one digital fault status output terminal coupled to the isolated driver communications interface for indicating the presence of a failure mode.

13. The half-bridge power module as recited in claim 8, further comprising at least one analog parameter output terminal coupled for monitoring an analog parameter of the module.

14. A half-bridge power module, comprising:

a first insulated gate bipolar power transistor, the first transistor having a gate drive terminal;

a second insulated gate bipolar power transistor, the second transistor having a gate drive terminal and forming a half-bridge inverter configuration with the first transistor, the half-bridge inverter configuration having an output;

a first overvoltage clamp and desaturation detection circuit, the first overvoltage clamp and desaturation detection circuit being coupled to the first transistor;

a second overvoltage clamp and desaturation detection circuits, the second overvoltage clamp and desaturation detection circuit being coupled to the second transistor;

an output current measurement system coupled to the output of the half-bridge inverter configuration;

a first junction temperature sensor coupled to the first transistor;

a second junction temperature sensor coupled to the second transistor;

a first isolation transformer having a primary winding, a first secondary winding and a second secondary winding;

a second isolation transformer having a primary winding, a first secondary winding and a second secondary winding;

a third isolation transformer having a primary winding, a first secondary winding and a second secondary winding;

an isolated driver communications interface coupled to the primary windings of the first and second isolation transformers, the isolated driver communications interface being for convening logic signals to primary winding drive signals;

a first isolated gate driver coupled to the first and second secondary windings of the first isolation transformer and the gate terminal of the first transistor;

a second isolated gate driver coupled to the first and second secondary windings of the second isolation transformer and the gate terminal of the second transistor;

an isolated power source coupled to the primary winding of the third isolation transformer; and a plurality of voltage regulators coupled to the first and second secondary windings of the third isolation transformer for supplying power to the first and second isolated gate drivers.

15. The half-bridge power module as recited in claim 14 wherein each of the first and second overvoltage clamp and desaturation detection circuits comprises an avalanche diode, the avalanche diode of the first overvoltage clamp and desaturation circuit being fabricated on a single semiconductor substrate with the first transistor, and the avalanche diode of the second overvoltage clamp and desaturation circuit being fabricated on a single semiconductor substrate with the second transistor.

16. The half-bridge power module as recited in claim 14, further comprising at least one digital fault status output terminal coupled to the isolated driver communications interface for indicating the presence of a failure mode.

17. The half-bridge power module as recited in claim 14, further comprising at least one analog parameter output terminal coupled for monitoring an analog parameter of the module.

\* \* \* \* \*